United States Patent
Kitagawa et al.

(10) Patent No.: US 9,780,298 B2
(45) Date of Patent: *Oct. 3, 2017

(54) MAGNETORESISTIVE ELEMENT

(71) Applicant: KABUSHIKI KAISHA TOSHIBA, Tokyo (JP)

(72) Inventors: Eiji Kitagawa, Yokohama (JP); Tadaomi Daibou, Yokohama (JP); Tadashi Kai, Tokyo (JP); Toshihiko Nagase, Yokohama (JP); Kenji Noma, Yokohama (JP); Hiroaki Yoda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/859,024

(22) Filed: Sep. 18, 2015

(65) Prior Publication Data

US 2016/0013398 A1  Jan. 14, 2016

Related U.S. Application Data

(63) Continuation of application No. 13/235,237, filed on Sep. 16, 2011, now Pat. No. 9,165,585.

(30) Foreign Application Priority Data

Sep. 16, 2010  (JP) .................................. 2010-208616

(51) Int. Cl.
*H01L 43/02* (2006.01)
*G01R 33/09* (2006.01)
(Continued)

(52) U.S. Cl.
CPC ............ *H01L 43/02* (2013.01); *G01R 33/091* (2013.01); *G01R 33/093* (2013.01); *G11B 5/66* (2013.01);
(Continued)

(58) Field of Classification Search
None
See application file for complete search history.

(56) References Cited

U.S. PATENT DOCUMENTS

| | | | |
|---|---|---|---|
| 6,278,592 B1 | 8/2001 | Xue et al. | |
| 6,369,993 B1 * | 4/2002 | Hayashi | B82Y 10/00 324/207.21 |

(Continued)

FOREIGN PATENT DOCUMENTS

| | | |
|---|---|---|
| JP | H02-194159 | 7/1990 |
| JP | 2000-106462 A | 4/2000 |

(Continued)

OTHER PUBLICATIONS

International Preliminary Report on Patentability dated Feb. 6, 2014 for PCT International Application No. PCT/JP2012/063574 filed May 21, 2012.

(Continued)

*Primary Examiner* — Kevin Bernatz
(74) *Attorney, Agent, or Firm* — Knobbe, Martens, Olson & Bear, LLP

(57) ABSTRACT

According to one embodiment, a magnetoresistive element includes a recording layer having a variable magnetization direction, a reference layer having an invariable magnetization direction, an intermediate layer provided between the recording layer and the reference layer, and a first buffer layer provided on a surface of the recording layer, which is opposite to a surface of the recording layer where the intermediate layer is provided. The recording layer comprises a first magnetic layer which is provided in a side of the intermediate layer and contains CoFe as a main component, and a second magnetic layer which is provided in a side of the first buffer layer and contains CoFe as a main component, a concentration of Fe in the first magnetic layer being (Continued)

higher than a concentration of Fe in the second magnetic layer. The first buffer layer comprises a nitrogen compound.

20 Claims, 12 Drawing Sheets

(51) Int. Cl.
| H01F 10/30 | (2006.01) |
| G11B 5/66 | (2006.01) |
| G11C 11/16 | (2006.01) |
| H01L 43/08 | (2006.01) |
| H01L 43/10 | (2006.01) |
| H01L 27/22 | (2006.01) |

(52) U.S. Cl.
CPC ............ *G11C 11/161* (2013.01); *H01F 10/30* (2013.01); *H01L 27/228* (2013.01); *H01L 43/08* (2013.01); *H01L 43/10* (2013.01)

(56) References Cited

U.S. PATENT DOCUMENTS

| 8,107,281 | B2 | 1/2012 | Kai et al. |
| 8,208,292 | B2 | 6/2012 | Kai et al. |
| 8,299,552 | B2 | 10/2012 | Nagase et al. |
| 8,374,025 | B1 | 2/2013 | Ranjan et al. |
| 8,609,262 | B2 | 12/2013 | Horng et al. |
| 8,680,632 | B2 | 3/2014 | Daibou et al. |
| 8,750,029 | B2 | 6/2014 | Kitagawa et al. |
| 8,895,162 | B2 | 11/2014 | Nishiyama et al. |
| 8,982,616 | B1 | 3/2015 | Ranjan et al. |
| 9,087,980 | B2* | 7/2015 | Daibou ............... H01L 43/10 |
| 9,165,585 | B2* | 10/2015 | Kitagawa ............ G11B 5/66 |
| 9,178,133 | B2* | 11/2015 | Kitagawa ............ G11C 11/161 |
| 9,219,227 | B2* | 12/2015 | Daibou ............... H01L 43/08 |
| 9,508,926 | B2* | 11/2016 | Kitagawa ............ H01L 43/08 |
| 9,620,561 | B2* | 4/2017 | Nagase ............... H01L 27/222 |
| 9,647,203 | B2* | 5/2017 | Kitagawa ............ H01L 43/10 |
| 2005/0019610 | A1 | 1/2005 | Fujikata et al. |
| 2005/0094320 | A1* | 5/2005 | Sano ................... G11B 5/3912 |
| | | | 360/319 |
| 2005/0254286 | A1 | 11/2005 | Valet |
| 2007/0047159 | A1 | 3/2007 | Zhao et al. |
| 2008/0232003 | A1* | 9/2008 | Ibusuki ............... B82Y 10/00 |
| | | | 360/324.11 |
| 2008/0246104 | A1* | 10/2008 | Ranjan ............... G11C 11/5607 |
| | | | 257/421 |
| 2008/0253174 | A1 | 10/2008 | Yoshikawa et al. |
| 2008/0266725 | A1* | 10/2008 | Shatz ................... B82Y 10/00 |
| | | | 360/324.11 |
| 2008/0273380 | A1 | 11/2008 | Diao et al. |
| 2009/0079018 | A1* | 3/2009 | Nagase ............... B82Y 25/00 |
| | | | 257/421 |
| 2009/0243008 | A1 | 10/2009 | Kitagawa et al. |
| 2009/0244790 | A1 | 10/2009 | Ibusuki et al. |
| 2009/0251951 | A1 | 10/2009 | Yoshikawa et al. |
| 2009/0256220 | A1 | 10/2009 | Horng et al. |
| 2010/0117169 | A1 | 5/2010 | Anderson et al. |
| 2010/0244163 | A1 | 9/2010 | Daibou et al. |
| 2011/0014500 | A1 | 1/2011 | Horng et al. |
| 2011/0032644 | A1* | 2/2011 | Watts ................... B82Y 25/00 |
| | | | 360/324.12 |
| 2011/0049659 | A1 | 3/2011 | Suzuki et al. |
| 2011/0073970 | A1 | 3/2011 | Kai et al. |
| 2011/0089940 | A1 | 4/2011 | Carey et al. |
| 2011/0227179 | A1 | 9/2011 | Kitagawa et al. |
| 2012/0068284 | A1* | 3/2012 | Kitagawa ............ H01L 43/08 |
| | | | 257/421 |
| 2012/0070695 | A1 | 3/2012 | Kitagawa et al. |
| 2012/0088125 | A1 | 4/2012 | Nishiyama et al. |
| 2012/0099369 | A1 | 4/2012 | Kai et al. |
| 2012/0155156 | A1* | 6/2012 | Watts ................... B82Y 25/00 |
| | | | 365/158 |
| 2012/0313191 | A1 | 12/2012 | Whig et al. |
| 2013/0307099 | A1 | 11/2013 | Kitagawa et al. |
| 2014/0035074 | A1 | 2/2014 | Jan et al. |
| 2014/0042573 | A1 | 2/2014 | Yamane et al. |
| 2014/0131649 | A1 | 5/2014 | Daibou et al. |
| 2014/0131824 | A1 | 5/2014 | Kitagawa et al. |
| 2016/0013397 | A1* | 1/2016 | Kitagawa ............ H01L 43/08 |
| | | | 257/421 |
| 2016/0043300 | A1* | 2/2016 | Kim ..................... H01L 43/08 |
| | | | 711/125 |
| 2016/0043305 | A1* | 2/2016 | Ochiai ................. H01L 43/08 |
| | | | 257/421 |
| 2016/0072046 | A1* | 3/2016 | Nagase ............... H01L 27/222 |
| | | | 257/421 |
| 2016/0099288 | A1* | 4/2016 | Watanabe ........... H01L 27/228 |
| | | | 257/295 |

FOREIGN PATENT DOCUMENTS

| JP | 2008-252018 | 10/2008 |
| JP | 2009/081314 | 4/2009 |
| JP | 2009-239121 A1 | 10/2009 |
| JP | 2009-253303 | 10/2009 |
| JP | 2010-232499 | 10/2010 |
| JP | 2010-238769 | 10/2010 |
| JP | 2011-023729 | 2/2011 |
| JP | 2011-071352 | 4/2011 |
| JP | 2012-064818 | 3/2012 |
| WO | WO 2007/015355 A | 2/2007 |
| WO | WO 2009-133650 A1 | 5/2009 |

OTHER PUBLICATIONS

International Search Report and Written Opinion dated Aug. 28, 2012 for PCT International Application No. PCT/JP2012/063574 filed May 21, 2012.
Office Action dated Feb. 3, 2015 for JP Application No. 2012-105812.
Office Action for Japanese Patent Application 2010-208616, mailed Sep. 11, 2012.
Office Action dated Jun. 30, 2015 in Japanese Patent Application No. 2012-105812, 11 pgs.
Office Action dated Oct. 9, 2014, in U.S. Appl. No. 14/160,419.
Yakushiji, Kay, et al., High Magnetoresistance Ratio and Low Resistance-Area Product in Magnetic Tunnel Junctions with Perpendicularly Magnetized Electrodes. Applied Physics Express, 3, 053003-1-053003-3, 2010.

* cited by examiner

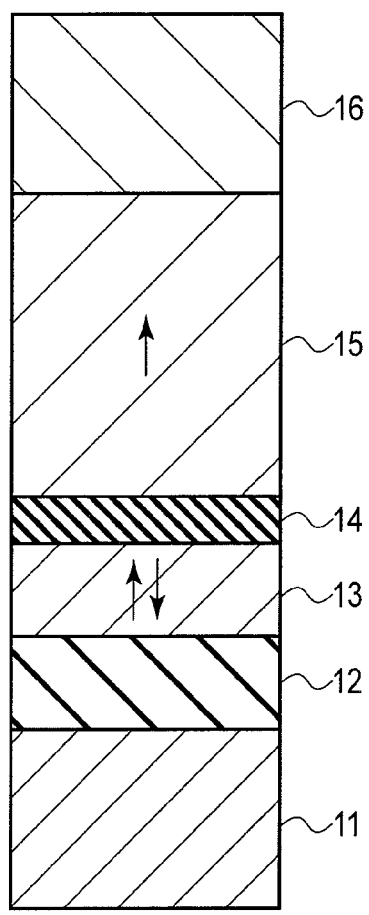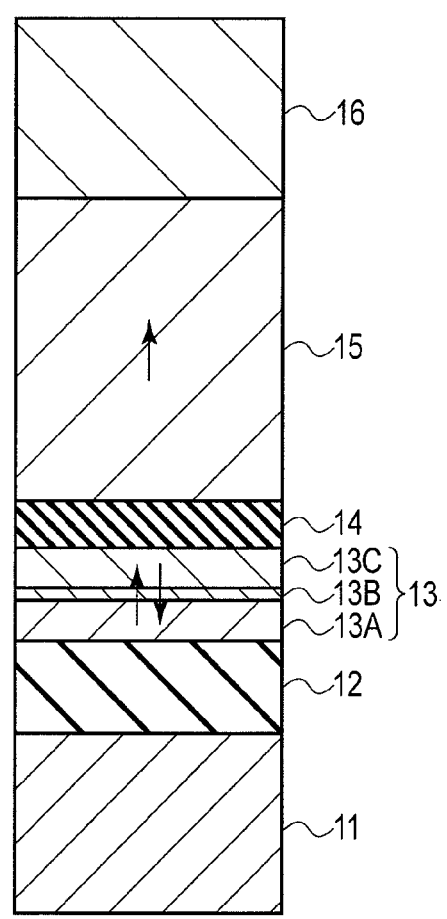
F I G. 1   F I G. 2

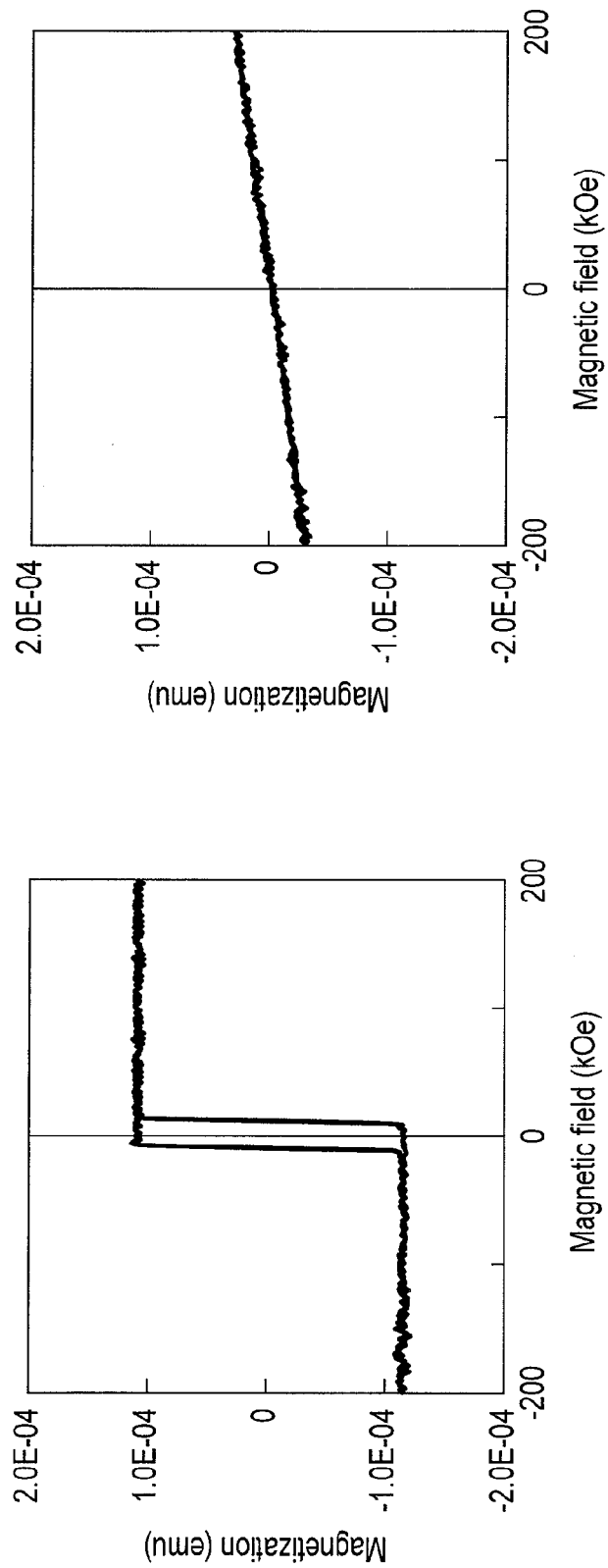
F I G. 3A
F I G. 3B

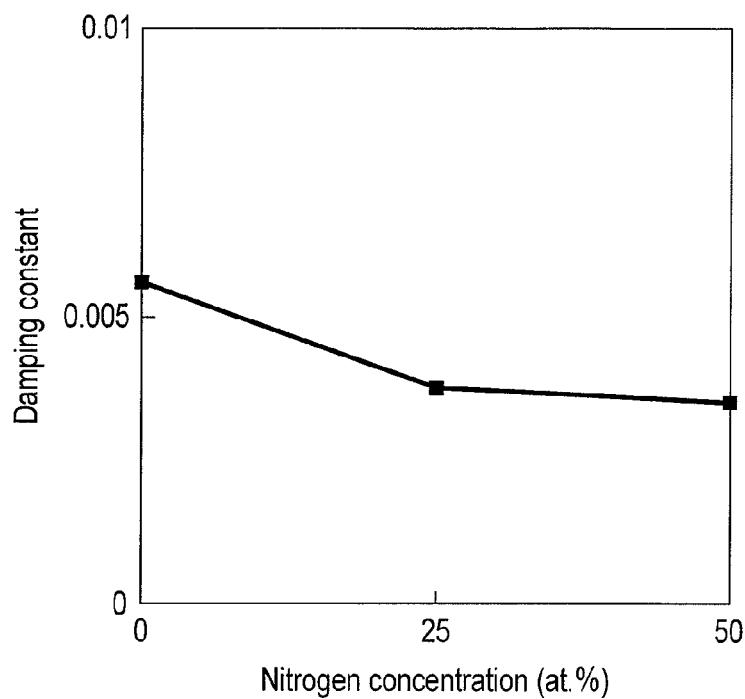
F I G. 4
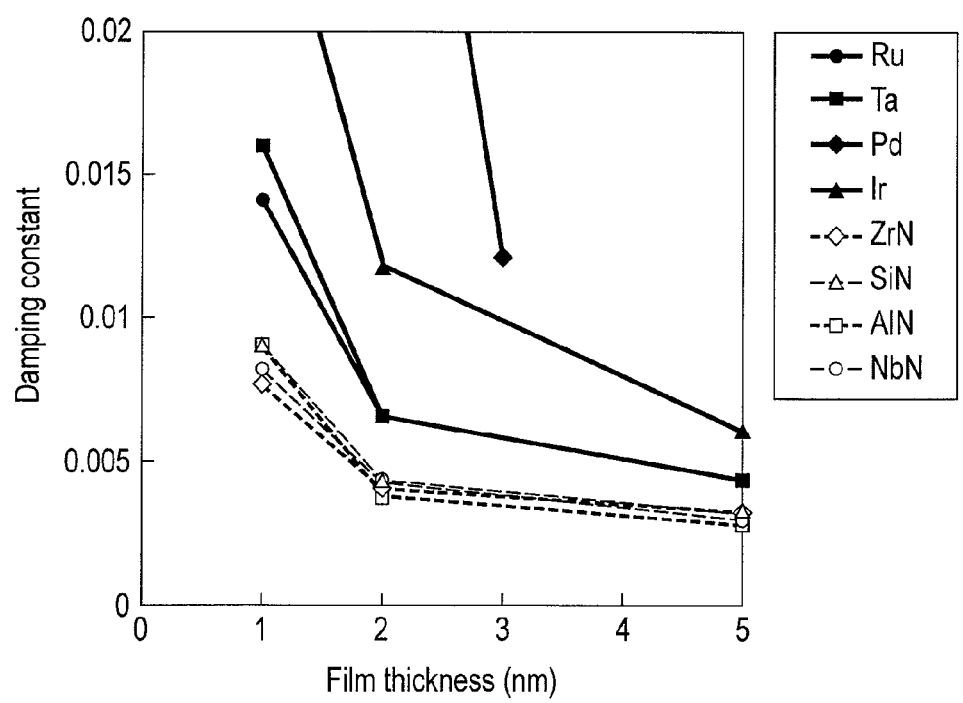
F I G. 5

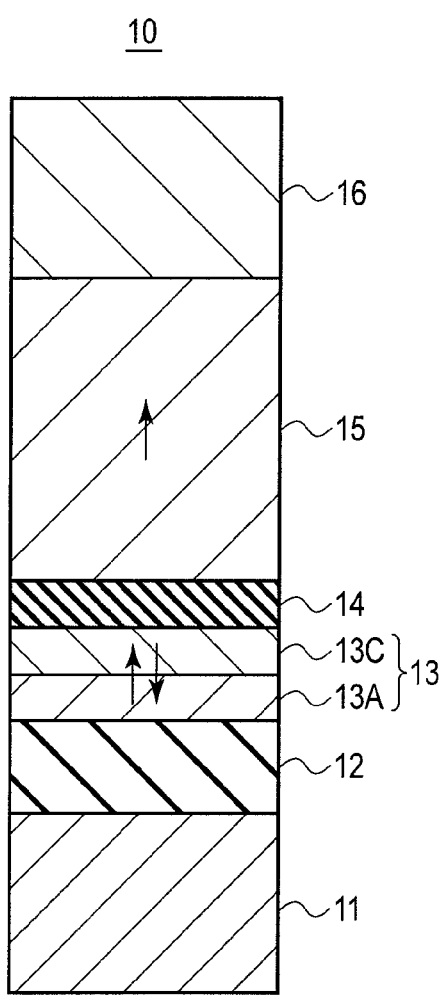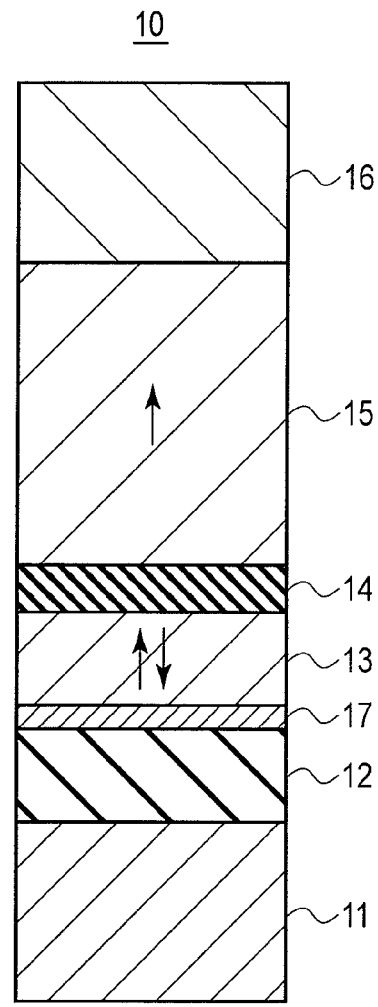
F I G. 8    F I G. 9

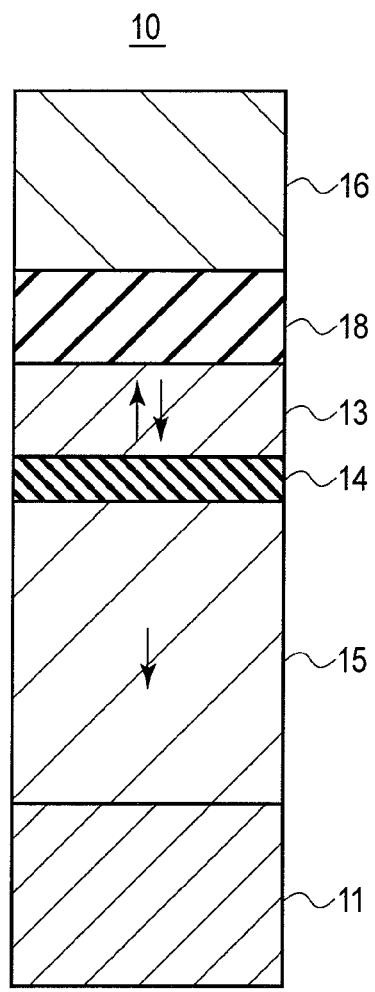
F I G. 10

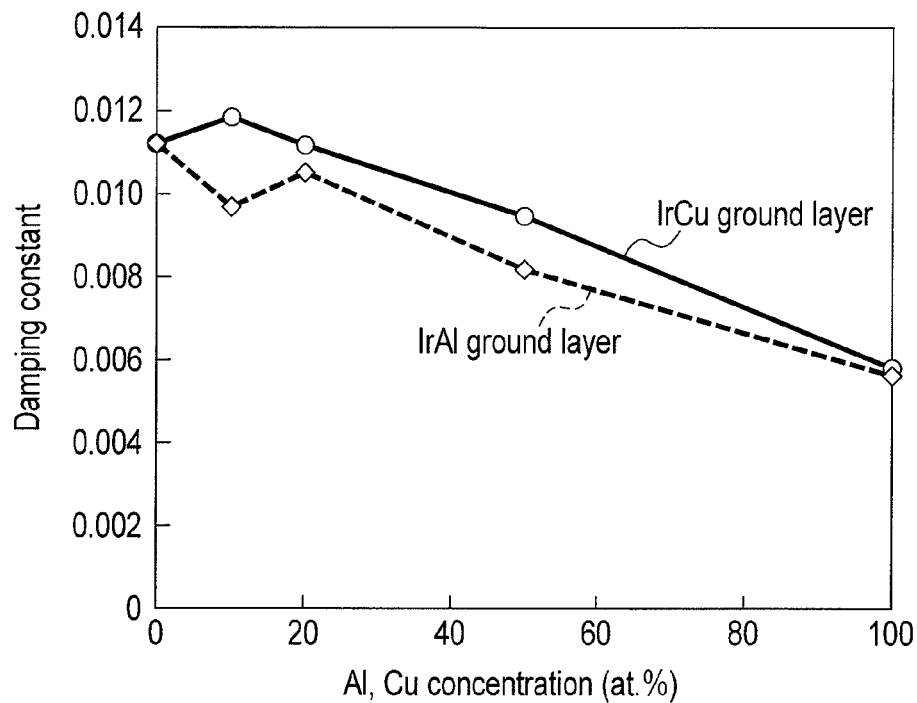
F I G. 11
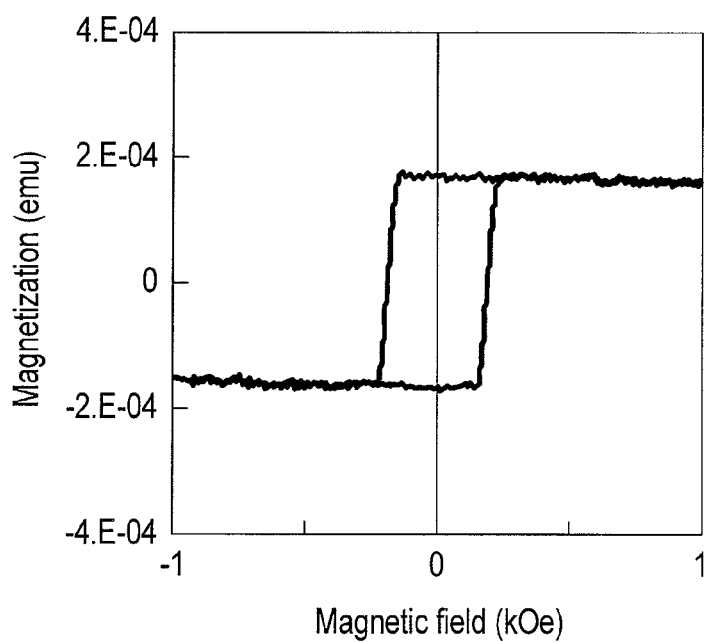
F I G. 12

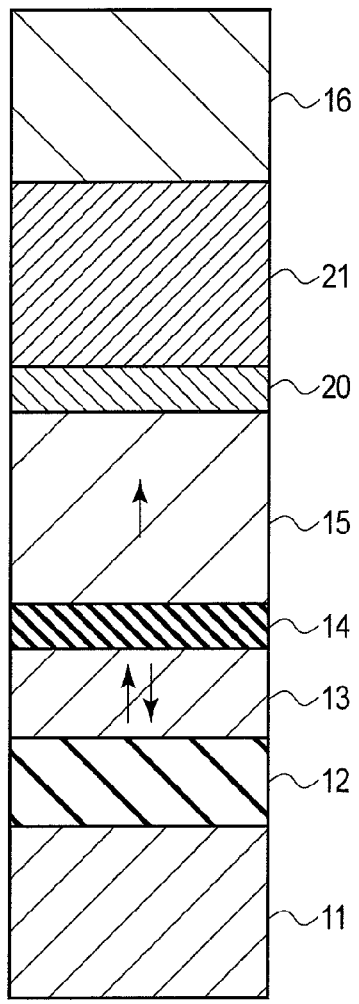 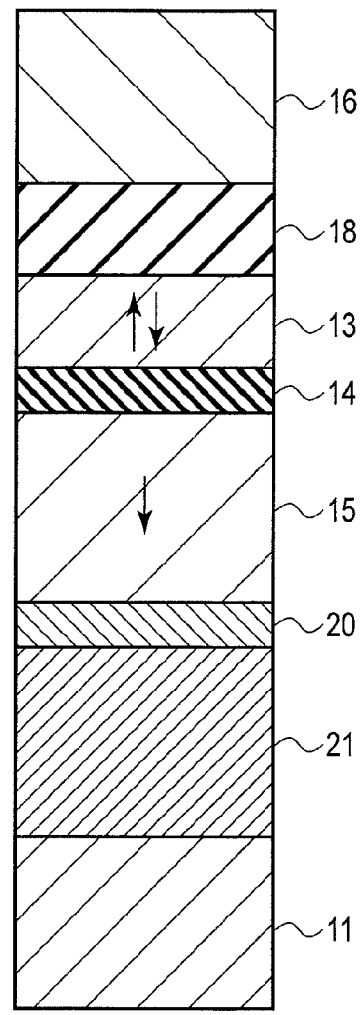
F I G. 15  F I G. 16

MAGNETORESISTIVE ELEMENT

CROSS-REFERENCE TO RELATED APPLICATIONS

This application is a continuation of Ser. No. 13/235,237, filed Sep. 16, 2011, which is based upon and claims the benefit of priority from prior Japanese Patent Application No. 2010-208616, filed Sep. 16, 2010, the entire contents of each which are incorporated herein by reference.

FIELD

Embodiments described herein relate generally to a magnetoresistive element.

BACKGROUND

A spin-injection magnetic random access memory (MRAM) which uses a perpendicular magnetization film as a recording layer is excellent for reducing a write current and achieving a large capacity. A stacked film of Cobalt (Co) having a dense atomic plane and Platinum (Pt) has a magnetocrystalline anisotropy as high as $10^7$ erg/cm$^2$ and has such a low resistance as to achieve a high magnetoresistance ratio (MR ratio). Therefore, the stacked film is notable as a technology for putting a large capacity MRAM to practical use.

Meanwhile, ruthenium (Ru) is used as a buffer for a CoPt alloy from a viewpoint of crystal matching. However, the Ru buffer increases a damping constant of a recording layer, and therefore involves a problem of a large writing current. In a spin-injection MRAM using a perpendicular magnetization film, a write current is proportional to the damping constant and inversely proportional to a spin polarizability, and increases in proportional to a square of an area size. Therefore, reduction of the damping constant, increase of the spin polarizability, and reduction of an area size are mandatory technologies to reduce the write current.

BRIEF DESCRIPTION OF THE DRAWINGS

FIG. 1 is a cross-sectional view showing a configuration of an MTJ element 10 according to the first embodiment;

FIG. 2 is a cross-sectional view showing an example configuration of the MTJ element 10;

FIGS. 3A and 3B are graphs showing magnetic characteristics of a recording layer 13 relative to a composition of an AlN buffer layer;

FIG. 4 is a graph showing a damping constant of a CoFeB layer relative to a nitrogen concentration of the AlN buffer layer;

FIG. 5 is a graph showing a relationship between a film thickness and a damping constant of the CoFeB layer;

FIG. 8 is a cross-sectional view showing an example configuration of the MTJ element 10;

FIG. 9 is a cross-sectional view showing an example configuration of the MTJ element 10;

FIG. 10 is a cross-sectional view showing an example configuration of the MTJ element 10;

FIG. 11 is a graph showing a composition of a buffer layer 12 and a damping constant of a recording layer 13, according to the second embodiment;

FIG. 12 is a graph showing a magnetic characteristic of a CoPd layer where an Ir buffer layer 12 is used;

FIG. 15 is a cross-sectional view showing a configuration of an MTJ element 10 according to the third embodiment;

FIG. 16 is a cross-sectional view showing an example configuration of the MTJ element 10;

DETAILED DESCRIPTION

Figure 6:
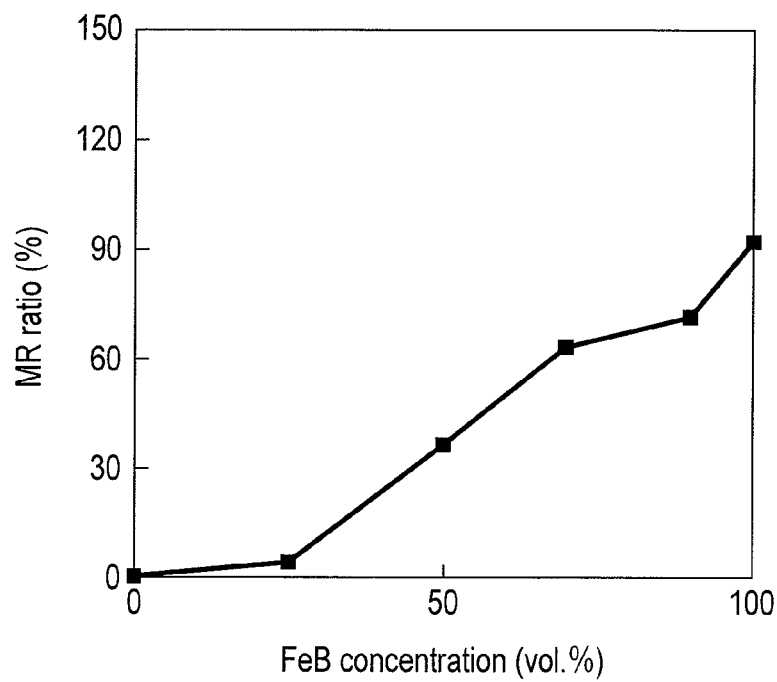
FIG. 6 is a graph showing a relationship between a concentration of the CoFeB layer and an MR ratio.

In general, according to one embodiment, there is provided a magnetoresistive element comprising:

a recording layer having magnetic anisotropy in a direction perpendicular to a film surface and having a variable magnetization direction;

a reference layer having magnetic anisotropy in a direction perpendicular to a film surface and having an invariable magnetization direction;

an intermediate layer provided between the recording layer and the reference layer; and a first buffer layer provided on a surface of the recording layer, which is opposite to a surface of the recording layer where the intermediate layer is provided, wherein the recording layer comprises a first magnetic layer which is provided in a side of the intermediate layer and contains CoFe as a main component, and a second magnetic layer which is provided in a side of the first buffer layer and contains CoFe as a main component, a concentration of Fe in the first magnetic layer being higher than a concentration of Fe in the second magnetic layer, and the first buffer layer comprises a nitrogen compound.

The embodiments will be described hereinafter with reference to the accompanying drawings. In the description which follows, the same or functionally equivalent elements are denoted by the same reference numerals, to thereby simplify the description.

First Embodiment

FIG. 1 is a cross-sectional view showing a configuration of an MTJ element 10 as a magnetoresistive element according to the first embodiment. The MTJ element 10 is configured by stacking a lower electrode 11, a buffer layer 12, a recording layer 13, an intermediate layer (tunnel barrier layer) 14, a reference layer 15, and an upper electrode 16 in this order from the bottom.

The recording layer 13 and reference layer 15 each are made of a ferromagnetic material, and have magnetic anisotropy in a direction perpendicular to a film surfaces. Directions of easy magnetization of the recording layer 13 and reference layer 15 are perpendicular to the film surfaces. That is, the MTJ element 10 is a perpendicular magnetization MTJ element in which magnetization directions of the recording layer 13 and reference layer 15 face in directions perpendicular to the film surfaces. A direction of easy magnetization is a direction which most decreases internal energy when spontaneous magnetization is directed in the direction in a state where no external magnetic field exists, supposing a ferromagnetic material having a macro size. Meanwhile, a direction of hard magnetization is a direction which maximizes internal energy when spontaneous magnetization is directed in the direction in a state where no external magnetic field exists, supposing a ferromagnetic material of a macro size.

The recording layer 13 has a variable (reversible) magnetization (or spin) direction. The reference layer 15 has an invariable (fixing) magnetization direction. The reference layer 15 is set so as to have a perpendicular magnetic anisotropic energy which is sufficiently greater than the recording layer 13. Setting of magnetic anisotropy can be achieved by adjusting a material configuration and a film thickness. In this manner, a magnetic inversion current of the recording layer 13 is decreased to make a magnetization inversion current of the reference layer 15 greater than that of the recording layer 13. An MTJ element 10 which comprises a recording layer 13 having a variable magnetization direction and a reference layer 15 having an invariable magnetization direction for a predetermined write current can be achieved.

The intermediate layer 14 is made of a non-magnetic material for which a non-magnetic metal, a non-magnetic semiconductor, or an insulating material can be used. When an insulating material is used for the intermediate layer 14, the intermediate layer 14 is called a tunnel barrier layer. When a metal is used for the intermediate layer 14, the intermediate layer 14 is called a spacer layer.

The buffer layer 12 has a function to improve magnetic anisotropy of the recording layer 13. A damping constant of the recording layer 13 sometimes increases depending on a material in contact with the recording layer 13, which is known as a spin pumping effect. The buffer layer 12 has a function to reduce the damping constant of the recording layer 13 by reducing the spin pumping. The buffer layer 12 is made of a nitrogenous compound, and a specific material thereof will be described later.

An example configuration of the MTJ element 10 will be described below. The lower electrode 11 is made of Ta(200)/Cu(200)/Ta(150). The buffer layer 12 is made of AlN(10)/Ir(30). The recording layer 13 is made of CoFeB(8)/Ta(3)/CoFe(5). The tunnel barrier layer 14 is made of MgO(10). The reference layer 15 is made of TbCoFe(120)/CoFeB(4)/Ta(3)/CoFeB(15). The upper electrode 16 is made of Ru(200)/Ta(50). Numerical values in parentheses, which are added to elements, each express a film thickness in units of Å (angstrom). Each element written in the left side of "/" is stacked above an element written in the right side thereof.

FIG. 2 is a cross-sectional view showing an example configuration of the MTJ element 10. As shown in FIG. 2, the recording layer 13 has a stacked structure in which a magnetic layer 13A, a non-magnetic layer 13B, and a magnetic layer 13C are stacked in this order from the bottom. The magnetic layer 13A is made of CoFe, and the non-magnetic layer 13B is made of tantalum (Ta). The magnetic layer 13C is made of CoFeB.

The AlN layer comprised in the buffer layer 12 is formed, for example, by sputtering aluminum with use of a mixed gas containing nitrogen ($N_2$) and Argon (Ar). FIGS. 3A and 3B are graphs showing magnetic characteristics of the recording layer 13 relative to compositions of the AlN layer comprised in the buffer layer 12. In FIGS. 3A and 3B, each horizontal axis represents a magnetic field (kOe) in a direction perpendicular to a film surface, and each vertical axis represents magnetization (emu) in a direction perpendicular to the film surface of the recording layer 13. The FIG. 3A shows a magnetic characteristic where an AlN buffer layer having a composition containing nitrogen at 25 at. % relative to aluminum (Al) is used. FIG. 3B shows a magnetic characteristic where an AlN buffer layer having a composition containing nitrogen at 50 at. % relative to aluminum (Al), namely a stoichiometric composition is used. In FIGS. 3A and 3B, "E" means an exponential function with a base of 10. The unit "at. %" means an atomic percentage.

As seen from FIGS. 3A and 3B, when a concentration of nitrogen relative to aluminum increases, the perpendicular magnetic characteristic of the recording layer 13 deteriorates. The deterioration of the perpendicular magnetic characteristic involves a decrease of the record retention energy (magnetic anisotropic energy), and use of the AlN buffer layer with the stoichiometric composition is therefore undesirable.

Since a high resistance layer is formed when the AlN buffer layer is used with the stoichiometric composition, a read output is caused to decrease when a read current is flowed. A resistance of the AlN buffer layer can be reduced and decrease of the read output can accordingly be reduced by using a composition containing less nitrogen than the stoichiometric composition or by thinning the AlN buffer layer with the stoichiometric composition.

The magnetic characteristic in FIG. 3B has smaller perpendicular magnetic anisotropy compared with the magnetic characteristic in FIG. 3A. However, even when the AlN buffer layer shown in FIG. 3B is used, the perpendicular magnetic anisotropy can be improved and a magnetic characteristic substantially equal to that in FIG. 3A can accordingly be obtained, by arranging a composition concerning Co and Fe in CoFeB(8) in CoFeB(8)/Ta(3)/CoFe(5) of the recording layer 13 so as to increase Fe relative to Co or by replacing CoFeB with FeB in the CoFeB(8). Further, the perpendicular magnetic anisotropy can be improved and a magnetic characteristic substantially equal to that in FIG. 3A can accordingly be obtained by arranging a composition concerning Co and Fe in CoFe(5) in CoFeB(8)/Ta(3)/CoFe(5) so as to increase Co relative to Fe or by replacing CoFe with Co in the CoFe(5).

FIG. 4 is a graph showing a damping constant of the CoFeB layer relative to a nitrogen concentration of the AlN buffer layer. The CoFeB layer has a film thickness of 2 nm. The horizontal axis in FIG. 4 represents the concentration (at. %) of nitrogen, and the vertical axis in FIG. 4 represents the damping constant of the CoFeB layer.

The damping constant of the CoFeB layer decreases in accordance with increase of the nitrogen concentration, and becomes smallest in the stoichiometric composition. Specifically, the nitrogen concentration is desirably small relatively to the stoichiometric composition, in order to increase the record retention energy of the recording layer 13. Inversely, the nitrogen concentration is desirably approximated to the stoichiometric composition, in order to reduce a write current for the recording layer 13. However, at the very least, provided the magnetization of the recording layer 13 is perpendicular, information can be retained in the MRAM using a perpendicular magnetization film. Therefore, the nitrogen concentration of the AlN buffer layer needs to be controlled in a manner that nitrogen is insufficient relatively to the stoichiometric composition.

FIG. 5 is a graph showing a relationship between a film thickness of a CoFeB layer and a damping constant for each of various materials of the buffer layer. The horizontal axis in FIG. 5 represents a film thickness of the CoFeB layer, and the vertical axis in FIG. 5 represents the damping constant of the CoFeB layer. FIG. 5 shows cases where the materials of the buffer layer are ruthenium (Ru), tantalum (Ta), paradium (Pd), iridium (Ir), zirconium nitride (ZrN), silicon nitride (SiN), aluminum nitride (AlN), and niobium nitride (NbN).

When the film thickness of the recording layer 13 decreases, the magnetic characteristic of the recording layer 13 changes, due to the influence of spin pumping of the buffer layer 12 and changes in mixture of the stacked structure or an electronic state, which occur in an interface between the buffer layer 12 and the recording layer 13. Accordingly, the damping constant of the recording layer 13 increases. Since the increase of the damping constant involves an increase of a write current, the damping constant needs to be reduced.

Meanwhile, an increase of the film thickness of the recording layer 13 causes a decrease of efficiency of spin injection writing as the spin is lost in the magnetic material. The increase of the film thickness therefore causes an increase of the write current. That is, a reduction of the damping constant of the recording layer 13 and thinning of the recording layer 13 are needed to reduce the write current. These two conditions are contrary to each other from FIG. 5. Ideally, for reduction of the write current, it is desirable to use a material which prevents the damping constant of the recording layer 13 from increasing even when the film thickness of the recording layer 13 decreases.

According to FIG. 5, the AlN buffer layer can reduce the damping constant even when the film thickness of the recording layer 13 decreases, and the AlN buffer layer can therefore reduce the write current. The write current can be reduced also by using a nitrogenous compound such as zirconium nitride (ZrN), niobium nitride (NbN), or silicon nitride (SiN), as an alternative of aluminum nitride (AlN). Since these nitrogenous compounds have a strong anti-diffusion characteristic against heat, diffusion of the buffer layer 12 and recording layer 13 can be suppressed, and variation of the magnetic characteristic of the MTJ element 10 can be suppressed.

FIG. 6 is a graph showing changes of a magnetoresistance ratio (MR ratio) where concentrations of CoB and FeB in the CoFeB layer in a side of an MgO barrier (tunnel barrier layer 14) in the recording layer 13 are changed. CoB has a composition of Co:B=80 at. %:20 at. %. FeB has a composition of Fe:B=80 at. %:20 at. %. The horizontal axis in FIG. 6 represents the concentration of FeB (vol. %), and the vertical axis in FIG. 6 represents the MR ratio (%). The unit "vol. %" expresses a concentration as a volume percentage.

As seen from FIG. 6, the MR ratio improves as the composition of the CoFeB layer in a side of the MgO barrier in the recording layer 13 is biased so as to increase the concentration of iron (Fe) to be greater than that of cobalt (Co). This is because the crystal structure of iron (Fe) is a body-centered cubic (bcc) structure while the crystal structure of cobalt (Co) is a hexagonal close-packed (hcp) structure. Therefore, iron (Fe) has more excellent crystal matching relative to the MgO barrier than cobalt (Co).

Figure 7:
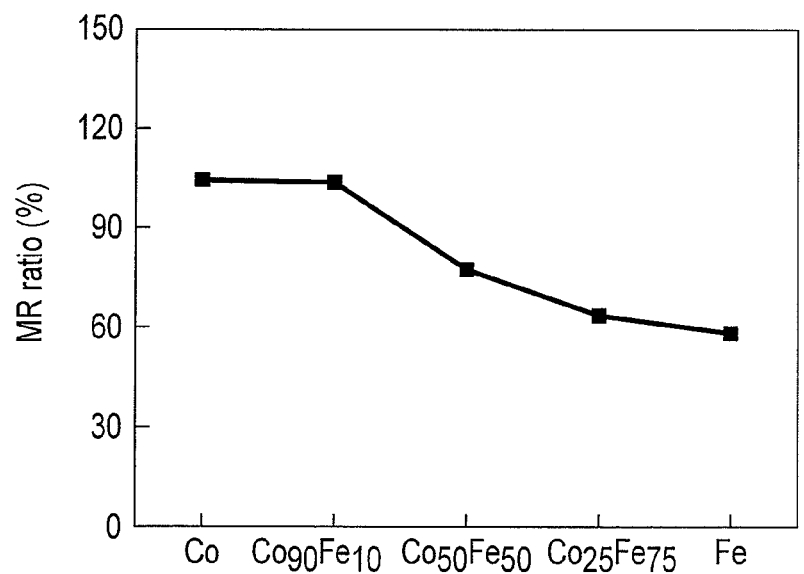
FIG. 7 is a graph showing a change of the MR ratio relative to the composition of the CoFeB layer.

FIG. 7 is a graph showing changes of the MR ratio relative to the composition of the CoFe layer in a side of the buffer layer 12 in the recording layer 13. The horizontal axis in FIG. 7 represents the composition of the CoFe layer, and the vertical axis in FIG. 7 represents the MR ratio (%).

According to FIG. 7, the MR ratio improves as the composition of the CoFe layer in the side of the buffer layer 12 in the recording layer 13 is biased so as to increase the concentration of cobalt (Co) to be greater than that of iron (Fe). The concentration of cobalt (Co) in the CoFe layer desirably satisfies Co>50 at. %, or more desirably satisfies Co≥90 at. %.

The magnetization layer 13A in the buffer layer 12 of the recording layer 13 may be made only of Co. Specifically, the recording layer 13 may be made of CoFeB(8)/Ta(3)/Co(5). Even when the magnetic layer 13A in the side of the buffer layer 12 in the recording layer 13 is made of a Co layer, the MR ratio can be improved, as shown in FIG. 7.

Further, the magnetic layer 13C in a side of the MgO barrier in the recording layer 13 may be made only of FeB. Specifically, the recording layer 13 may be made of FeB(8)/Ta(3)/Co(5) or FeB(8)/Ta(3)/CoFe(5). Even when the magnetic layer 13C in the side of the MgO barrier in the recording layer 13 is made of an FeB layer, the MR ratio can be improved as shown in FIG. 6.

Results of FIGS. 6 and 7 are summarized as follows. The MTJ element 10 having a high MR ratio can be formed by adjusting the magnetic layer 13C in the side of the MgO barrier in the recording layer 13 to have a composition containing a greater amount of iron (Fe) and by adjusting the magnetic layer 13A in the side of the buffer layer 12 in the recording layer 13 to have a composition containing a greater amount of Co. In other words, the perpendicular magnetic characteristic of the recording layer 13 can be improved by setting the concentration of iron (Fe) of the magnetic layer 13C in the side of the MgO barrier to be greater than the concentration of iron (Fe) of the magnetic layer 13A in the side of the buffer layer 12.

The non-magnetic layer 13B comprised in the recording layer 13 may use a non-magnetic layer made of tungsten (W), niobium (Nb), molybdenum (Mo), aluminum nitride (AlN), niobium nitride (NbN), zirconium nitride (ZrN), or silicon nitride (SiN) in place of tantalum (Ta). However, when the film thickness of the non-magnetic layer 13B inserted between the CoFeB layer and the CoFe layer is increased, spin diffusion increases within a recording layer. Therefore, the film thickness of the non-magnetic layer 13B is desirably 1 nm or less.

FIG. 8 is a cross-sectional view showing another example configuration of the MTJ element 10. The recording layer 13 is configured by stacking the magnetic layers 13A and 13C. That is, the non-magnetic layer 13B is excluded from the recording layer 13 shown in FIG. 2. The magnetic layer 13CA is made of a CoFe layer or a Co layer, and the magnetic layer 13C is made of a CoFeB layer or an FeB layer.

The non-magnetic layer 13B can increase the perpendicular magnetic anisotropy of magnetic layers and can also increase the magnetoresistive effect (MR ratio). Inversely, the non-magnetic layer 13B involves an increase of the damping constant. By eliminating the non-magnetic layer 13B, the damping constant can be reduced and the write current can be reduced. Deterioration of the perpendicular magnetic anisotropy caused by excluding the non-magnetic layer 13B can be prevented by adjusting the compositions of the magnetic layers 13A and 13C. Further, the perpendicular magnetic characteristic and magnetoresistance effect (MR ratio) of the recording layer 13 can be improved by increasing the concentration of iron (Fe) in the magnetic layer 13C in the side of the MgO barrier to be greater than that of iron (Fe) in the magnetic layer 13A in the side of the buffer layer 12. For example, the perpendicular magnetic characteristic and the magnetoresistance effect (MR ratio) can be improved by using CoFeB(8)/CoFe(5) in which the concentration of iron (Fe) in the side of the MgO barrier is greater than that of iron (Fe) in the side of the buffer layer 12 in the magnetic layer 13A or by using FeB(8)/CoFe(5), FeCoB(8)/Co(5), or FeB(8)/Co(5).

Alternatively, the recording layer 13 may be a single layer of a CoFeB layer. When the recording layer 13 is made of a CoFeB layer, the MR ratio can be improved by biasing the concentration of iron (Fe) so as to be greater than that of cobalt (Co), as shown in FIG. 6.

Further, the perpendicular magnetic anisotropy improves by inserting iridium (Ir) having a film thickness of 1 nm or less between the recording layer 13 and the buffer layer 12. FIG. 9 is a cross-sectional view showing another example configuration of the MTJ element 10. As shown in FIG. 9, a buffer layer 17 made of iridium (Ir) having a film thickness of 1 nm or less is provided between the recording layer 13 and the buffer layer 12. Since a thick Ir layer increases the damping constant of the recording layer 13, the Ir layer desirably has a film thickness of 1 nm or less. In place of iridium, palladium (Pd) or platinum (Pt) may be used as a material of the buffer layer 17. However, the buffer layer 17 needs to be thinned so as not to increase the damping constant of the recording layer 13.

The AlN layer may be used not as a buffer layer for the recording layer 13 but as a cap layer for the recording layer 13. FIG. 10 is a cross-sectional view showing another example configuration of the MTJ element 10. The MTJ element 10 is configured by stacking a lower electrode 11, a reference layer 15, an intermediate layer (tunnel barrier layer) 14, a recording layer 13, a gap layer 18, and an upper electrode 16 in this order from the bottom. The cap layer 18 is made of the same material as the buffer layer 12 described above. Also in the configuration shown in FIG. 10, reduction of the write current, perpendicular magnetic anisotropy of the MTJ element 10, and reduction of variation of the write current can be achieved as effects, as in the case of using the buffer layer 12 described above. Further, a magnetic layer made of the same material as the buffer layer 17 may be inserted between the recording layer 13 and the cap layer 18, for the same reason as described for the configuration shown in FIG. 9. In this manner, the perpendicular magnetic anisotropy of the recording layer 13 improves.

As specifically described above, the buffer layer 12 is configured by using a nitride compound capable of reducing the spin pumping effect, according to the first embodiment. Further, the recording layer 13 provided on the buffer layer 12 comprises the magnetic layer 13C, which is provided in the side of the tunnel barrier layer 14 and contains CoFe as a main component, and the magnetic layer 13A, which is provided in the side of the buffer layer 12 and contains CoFe as a main component. The concentration of iron (Fe) of the magnetic layer 13C is set to be higher than that of iron (Fe) of the magnetic layer 13A.

Therefore, according to the first embodiment, the damping constant of the recording layer 13 can be reduced, and the write current for the MTJ element 10 can accordingly be reduced. Further, the MR ratio of the MTJ element 10 can be improved and the perpendicular magnetic characteristic of the recording layer 13 can be improved, by configuring the recording layer 13 with use of the stacked structure as described above.

Since the buffer layer 12 made of a nitrogen compound has a strong anti-diffusion characteristic against heat, diffusion of the buffer layer 12 and the recording layer 13 can be suppressed, and accordingly, variation of the magnetic characteristic of the MTJ element 10 can be suppressed.

In addition, a non-magnetic layer such as an Ir layer is inserted between the recording layer 13 and the buffer layer 12. The perpendicular magnetic anisotropy of the recording layer 13 can be thereby improved.

Second Embodiment

An MTJ element 10 according to the second embodiment has the same cross-sectional structure as shown in FIG. 1. A recording layer 13 can have the same configuration as described in the first embodiment. According to the second embodiment, IrAl or IrCu in which aluminum (Al) or copper (Cu) capable of reducing the spin pumping effect is contained in iridium (Ir) is used for the buffer layer 12.

FIG. 11 is a graph showing a relationship between an Al concentration in an IrAl buffer layer and a damping constant of the recording layer 13, as well as a relationship between a Cu concentration in an IrCu buffer layer and a damping constant of the recording layer 13. In FIG. 11, a determination is made using a recording layer 13 having a film thickness of 2 nm. The horizontal axis in FIG. 11 represents the concentration (at. %) of aluminum (Al) or copper (Cu), and the vertical axis in FIG. 11 represents the damping constant of the recording layer 13.

According to FIG. 11, when aluminum (Al) or copper (Cu) is added to iridium (Ir), the damping constant of the recording layer 13 decreases in proportion to the concentration of aluminum (Al) or copper (Cu). As a result, the write current can be reduced. In the meantime, addition of iridium (Ir) to aluminum (Al) or copper (Cu) decreases the perpendicular magnetic characteristic of the recording layer 13. Therefore, the concentration of aluminum (Al) or copper (Cu) is limited.

Figure 13:
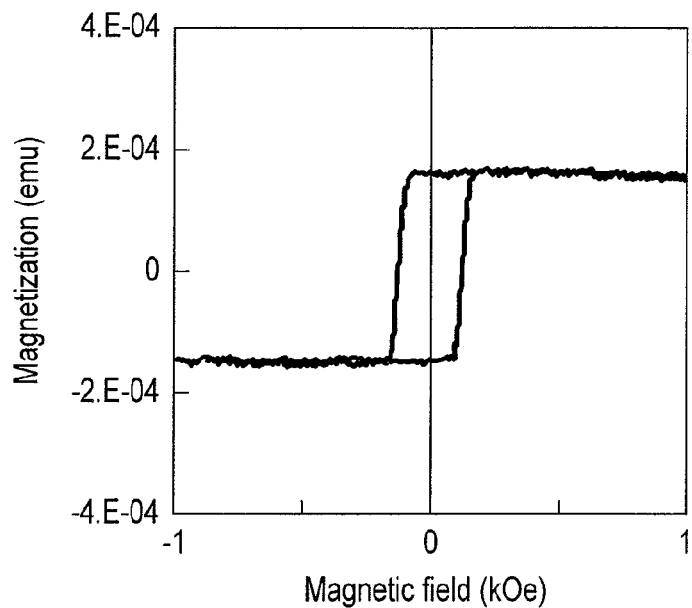
FIG. 13 is a graph showing a magnetic characteristic of the CoPd layer where an IrCu buffer layer 12 is used.
Figure 14:
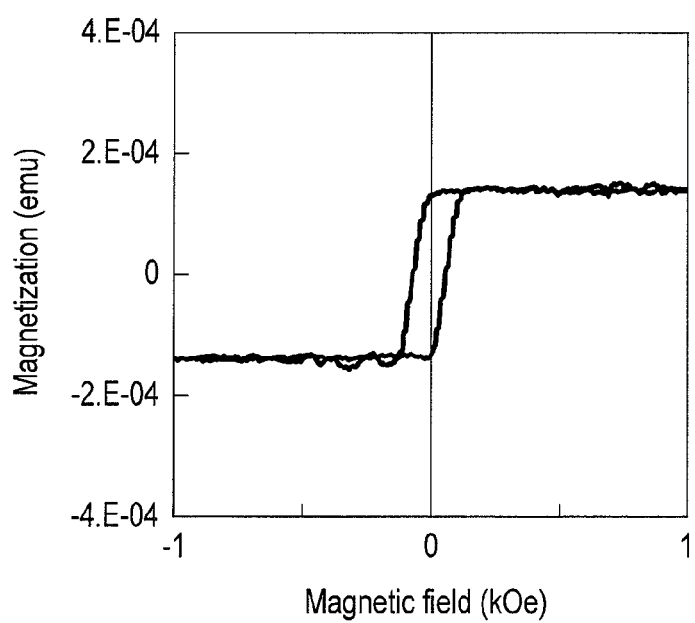
FIG. 14 is a graph showing a magnetic characteristic of the CoPd layer where an IrAl buffer layer 12 is used.

FIG. 12 is a graph showing a magnetic characteristic of the CoPd layer when neither copper (Cu) nor aluminum (Al) is added to iridium (Ir), i.e., when a buffer layer 12 made only of iridium (Ir) is used. FIG. 13 is a graph showing a magnetic characteristic of a CoPd layer when a buffer layer 12 made of iridium (Ir) added with copper (Cu) of 50 at. % is used. FIG. 14 is a graph showing a magnetic characteristic of the CoPd layer when a buffer layer 12 made of iridium (Ir) added with aluminum (Al) of 50 at. % is used. In FIGS. 12 to 14, each horizontal axis represents a magnetic field (kOe) in a direction perpendicular to a film surface, and each perpendicular axis represents magnetization (emu) in the direction perpendicular to the film surface of the recording layer 13.

From comparison between FIGS. 12 and 13, perpendicular magnetic anisotropy of the recording layer 13 is found to have deteriorated by adding copper (Cu) of 50 at. % to an Ir buffer layer. From comparison between FIGS. 12 and 14 as well, the perpendicular magnetic anisotropy of the recording layer 13 is found to have deteriorated by adding aluminum (Al) of 50 at. % to an Ir buffer layer.

Deterioration of the perpendicular magnetic anisotropy causes deterioration of the record retention energy, or namely, deterioration of a retention characteristic. Therefore, excessive deterioration of the perpendicular magnetic anisotropy disables practical use of an MRAM device. However, as the perpendicular magnetic anisotropy increases excessively, the write current is increased, and therefore, proper control of the perpendicular magnetic anisotropy is required. That is, there is an optimal value for the perpendicular magnetic anisotropy of the recording layer 13, and control is performed to attain adequate perpendicular anisotropy. Therefore, addition of copper (Cu) or aluminum (Al) to the Ir buffer layer is desirable. Thus, reduction of the write current is possible from both viewpoints of control of the damping constant and control of the perpendicular magnetic anisotropy by adding copper (Cu) or aluminum (Al) to the Ir buffer layer.

The same effects as described above can be achieved by using palladium (Pd) or platinum (Pt) in place of iridium (Ir). As a material to be added to the iridium (Ir), palladium (Pd), or platinum (Pt), a material capable of reducing the spin pumping effect can be used, as an alternative of aluminum (Al) and copper (Cu), i.e., zirconium (Zr), niobium (Nb), rhodium (Rh), or silicon (Si) can be used. In brief, the buffer layer 12 is configured by a composition which contains a first element selected from iridium (Ir), palladium (Pd), and platinum (Pt), and a second element selected from aluminum (Al), copper (Cu), zirconium (Zr), niobium (Nb), rhodium (Rh), and silicon (Si). Further, it is undesirable that the perpendicular magnetic anisotropy of the recording layer 13 deteriorates to be lower than the characteristics shown in FIGS. 13 and 14. Accordingly, the second element desirably has a concentration of 50 at. %.

As specifically described above, according to the second embodiment, the damping constant of the recording layer 13 can be reduced, and the write current of the MTJ element 10 can therefore be reduced. The other effects are the same as those in the first embodiment.

Third Embodiment

According to the third embodiment, a bias layer 21 having a function to reduce a magnetic field which leaks from the reference layer 15 is newly added, and a magnetic coercive force Hc of the recording layer 13 is prevented from shifting due to the leaking magnetic field.

FIG. 15 is a cross-sectional view showing a configuration of the MTJ element 10 according to the third embodiment. The MTJ element 10 shown in FIG. 10 is configured by newly adding the bias layer 21 and a non-magnetic layer 20 to the configuration shown in FIG. 1.

The bias layer 21 is provided to prevent the magnetic coercive force Hc of the recording layer 13 from shifting under influence of the magnetic field which leaks from the reference layer 15, thereby to prevent thermal stability of a magnetization configuration of the reference layer 15 and the recording layer 13 from changing between a parallel state and an antiparallel state. The same perpendicular magnetization film as the reference layer 15 can be used as the bias layer 21.

The non-magnetic layer 20 is provided to antiferromagnetically couple the bias layer 21 and the reference layer 15 so as to make their magnetization directions to be antiparallel to each other. Further, the non-magnetic layer 20 has a heat resistance to prevent the bias layer 21 and the reference layer 15 from being mixed through a thermal process, and a function to control crystal orientation when the bias layer 21 is formed. As the non-magnetic layer 20, a non-magnetic metal made of ruthenium (Ru), silver (Ag), or copper (Cu) can be used.

A magnetic layer made of CoFe, Co, Fe, CoFeB, CoB, or FeB may be inserted between the bias layer 21 and the non-magnetic layer 20 and between the reference layer 15 and the magnetic layer 20. In this manner, antiferromagnetic coupling between the bias layer 21 and the reference layer 15 through the non-magnetic layer 20 can be strengthened.

FIG. 16 is a cross-sectional view showing another example configuration of the MTJ element 10. The MTJ element 10 shown in FIG. 16 is configured by newly adding the bias layer 21 and the non-magnetic layer 20 to the configuration shown in FIG. 10. According to the MTJ element 10 shown in FIG. 16, the same effects as described above can be obtained.

As specifically described above, a magnetic field which leads from the reference layer 15 can be reduced by the bias layer 21, according to the third embodiment. In this manner, shifting of the magnetic coercive force Hc of the recording layer 13 due to the leaking magnetic field can be reduced. As a result, variation of an inverted magnetic field of the recording layer 13 can be reduced among MTJ elements 10. Further, magnetization of the reference layer 15 can be fixed rigidly in one direction by providing the bias layer 21.

Fourth Embodiment

Since an AlN buffer layer is a high resistance layer, a read output decreases when a read current which is sufficiently small relatively to a write current is flowed through an MTJ element 10. Accordingly, the AlN buffer layer is desirably made electrically conductive. According to the fourth embodiment, a lower electrode 11 and a recording layer 13 are made electrically conductive to each other by providing a conductive layer 23 on a side wall of the buffer layer 12.

Figure 17:
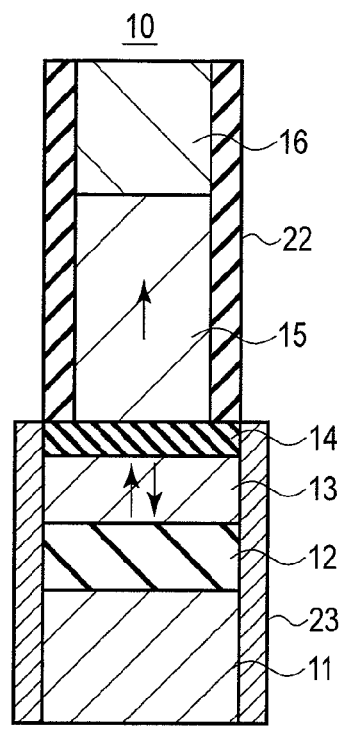
FIG. 17 is a cross-sectional view showing a configuration of an MTJ element 10 according to the fourth embodiment.

FIG. 17 is a cross-sectional view showing a configuration of the MTJ element 10 according to the fourth embodiment. The MTJ element 10 has the same structure as shown in FIG. 1. A conductive layer 23 is provided on a circumferential surface of a stacked structure comprising the lower electrode 11, buffer layer 12, recording layer 13 and tunnel barrier layer 14. The conductive layer 23 is not limited to the configuration of FIG. 17 but may be provided at least on a side surface of the buffer layer 12 and electrically connected to the lower electrode 11 and recording layer 13.

A protect film 22 is provided on a circumferential surface of a stacked structure comprising a reference layer 15 and an upper electrode 16. As the protect film 22, an insulating material is used. For example, magnesium oxide (MgO), silicon nitride (SiN), silicon oxide (SiO$_2$), aluminum nitride (AlN), or aluminum oxide (AlO) are used.

In the MTJ element 10 configured in this manner, for example, a current path can be provided on a side wall of the buffer layer 12 made of AlN. Accordingly, if the buffer layer 12 is highly resistive, the resistance between the lower electrode 11 and the recording layer 13 can be reduced. Therefore, if a read current is flowed through the MTJ element 10 when data is read, a read output can be increased.

Next, a method for manufacturing the MTJ element 10 will be described with reference to the drawings.

Figure 18:
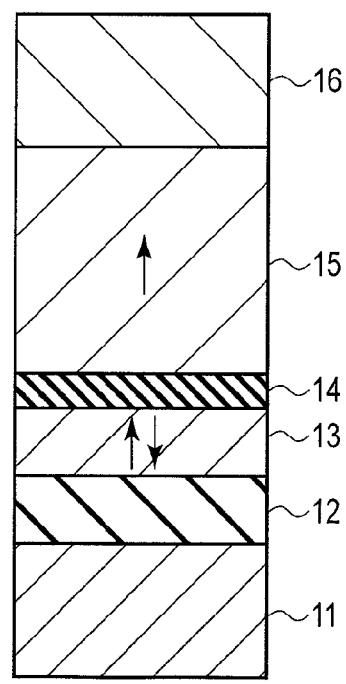
FIG. 18 is a cross-sectional view showing a manufacturing process of the MTJ element 10.
Figure 19:
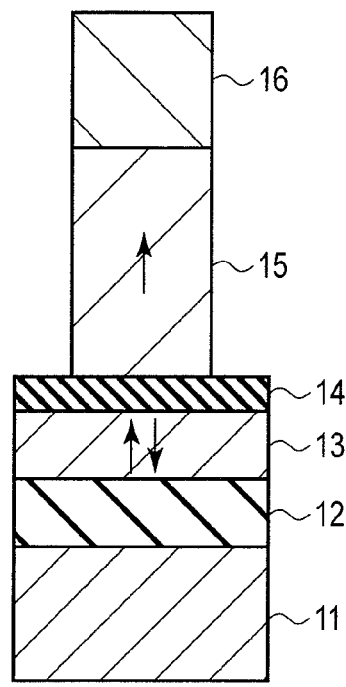
FIG. 19 is a cross-sectional view showing a manufacturing process of the MTJ element 10.

At first, as shown in FIG. 18, the lower electrode 11, buffer layer 12, recording layer 13, intermediate layer (tunnel barrier layer) 14, reference layer 15, and upper electrode 16 are deposited in this order, to form an MTJ film. Subsequently, as shown in FIG. 19, the upper electrode 16 and reference layer 15 are processed according to an ion milling method with use of a metal mask, an insulating mask, or a resist mask (unillustrated). At this time, the milling is carried out while detecting an element of magnesium (Mg) or oxygen in MgO as the tunnel barrier layer 14, according to secondary ion mass spectrometry (SIMS). The milling is stopped on an upper surface of the tunnel barrier layer 14. A milling angle is desirably 20 degrees or less to perpendicularly process a side surface of the reference layer 15.

Figure 20:
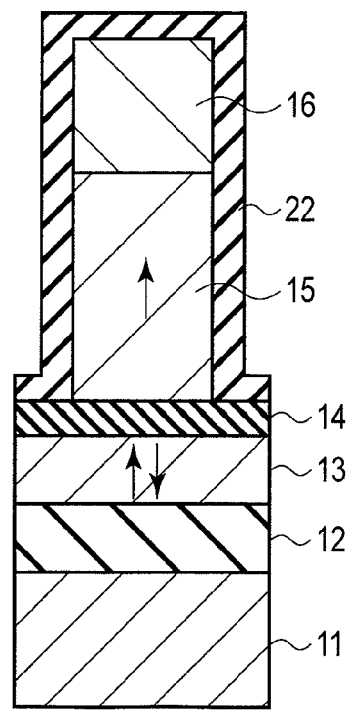
FIG. 20 is a cross-sectional view showing a manufacturing process of the MTJ element 10.

Subsequently, as shown in FIG. 20, the protect film 22 made of, for example, MgO is formed on the circumferential surfaces of the upper electrode 16 and the reference layer 15.

Subsequently, as shown in FIG. 17, the tunnel barrier layer 14, recording layer 13, buffer layer 12, and lower electrode 11 are processed at a milling angle of 10 degrees or less, for example, according to the ion milling method with the protect film 22 used as a mask. In the milling process, reaction products containing metals forming the lower electrode 11 and recording layer 13 stick to side surfaces of the tunnel barrier layer 14, recording layer 13, buffer layer 12, and lower electrode 11. In this manner, a conductive layer 23 made of the reaction products is formed on the circumferential surfaces of the tunnel barrier layer 14, recording layer 13, buffer layer 12, and lower electrode 11.

If the processes in the manufacturing process as described above are carried out as a multi-chamber process, oxidation damage on side walls of the MTJ element 10 can be suppressed. Accordingly, the perpendicular magnetic anisotropy and heat resistance of the MTJ element 10 can be improved, and variation of the magnetic characteristic can be reduced.

As specifically described above, according to the fourth embodiment, even when a high resistance material such as AlN is used for the lower layer 12, a read output at the time of flowing a read current which is sufficiently small relative to a write current can be prevented from decreasing. The fourth embodiment is further applicable to the MTJ element 10 shown in the third embodiment.

Fifth Embodiment

The fifth embodiment supposes a case that an MRAM is configured by using an MTJ element 10 as described above. Any of MTJ elements 10 described in the first to fourth embodiments can be used as the MTJ element 10.

Figure 21:
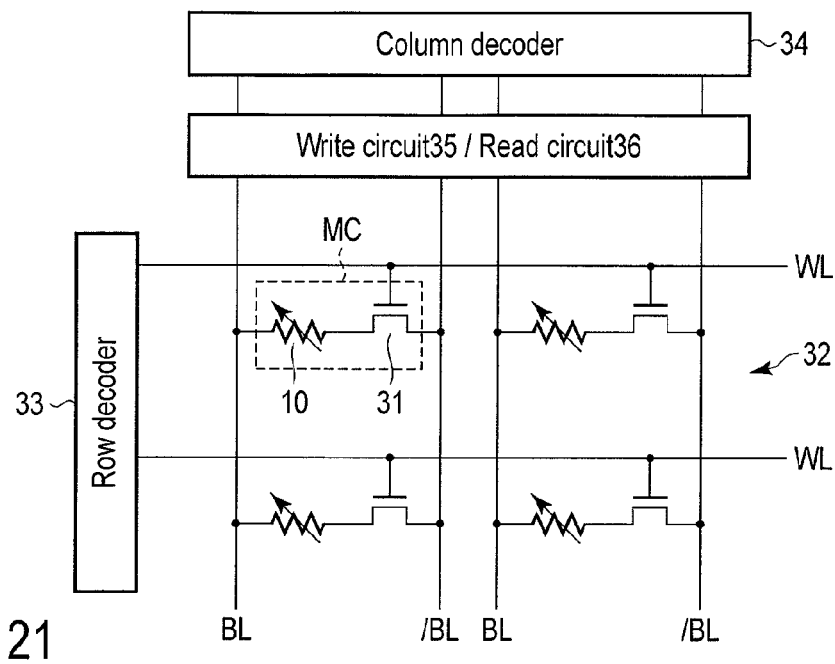
FIG. 21 is a circuit diagram showing a configuration of an MRAM according to the fifth embodiment.

FIG. 21 is a circuit diagram showing a configuration of the MRAM according to the fifth embodiment. The MRAM comprises a memory cell array 32 comprising a plurality of memory cells MC arrayed in a matrix. On the memory cell array 32, a plurality of bit line pairs (BL, /BL) each are provided so as to extend in a column direction. Also on the memory cell array 32, a plurality of word lines WL each are provided so as to extend in a row direction.

Memory cells MC are respectively provided at intersection regions between bit lines BL and word lines WL. Each of the memory cells MC comprises an MTJ element 10 and a selection transistor 31. For example, an N-channel metal-oxide-semiconductor (MOS) transistor is used as the selection transistor 31. An end of each MTJ element 10 is connected to a bit line BL. The other end of each MTJ element 10 is connected to a drain of a selection transistor 31. A gate of each selection transistor 31 is connected to a word line WL. A source of each selection transistor 31 is connected to a bit line /BL.

A row decoder 33 is connected to the word lines WL. A write circuit 35 and a read circuit 36 are connected to the bit line pairs (BL, /BL). A column decoder 34 is connected to the write circuit 35 and read circuit 36. Memory cells to be accessed when data is written or read are selected by the row decoder 33 and column decoder 34.

Writing of data into a memory cell is performed as follows. At first, in order to select a memory cell MC to write data into, a word line WL connected to the memory cell MC is activated by the row decoder. The selection transistor 31 is thereby turned on. Further, a bit line pair (BL, /BL) connected to the selected memory cell MC is selected by the column decoder 34.

The MTJ element 10 is supplied with one of write currents in two directions, in accordance with data to write. Specifically, when an MTJ element 10 is supplied with a write current from the left side to the right side of the figure, the write circuit 35 applies a positive voltage to a bit line BL, as well as a ground voltage to a bit line /BL. When the MTJ element 10 is supplied with a write current from the right side to the left side of the figure, the write circuit 35 applies a positive voltage to the bit line /BL, as well as a ground voltage to the bit line BL. Thus, data "0" or data "1" can be written into a memory cell MC.

Next, reading of data from a memory cell MC is performed as follows. At first, as in the case of writing, a selection transistor 31 of a selected memory cell MC is turned on. For example, the read circuit 36 supplies an MTJ element 10 with a read current which flows from the right side to the left side of the figure. The read current is set to a smaller value than a threshold which is magnetically inverted by spin injection. Further, a sense amplifier comprised in the read circuit 36 detects a resistance value of an MTJ element 10, based on the read current. In this manner, data stored in the MTJ element 10 can be read.

Figure 22:
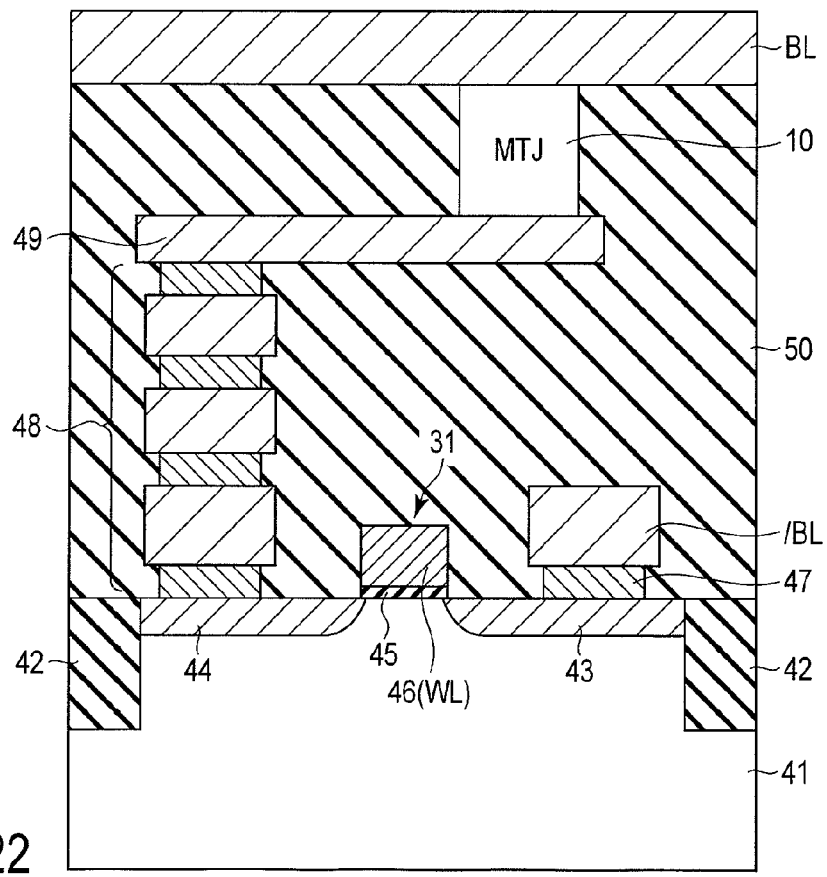
FIG. 22 is a cross-sectional view showing a configuration of the MRAM.

Next, an example structure of an MRAM will be described. FIG. 22 is a cross-sectional view showing a configuration of the MRAM. In a P-type semiconductor substrate 41, there is provided an element isolation/insulation layer 42 having a shallow trench isolation (STI) structure. An N-channel MOS transistor as a selection transistor 31 is provided in an element region (active region) surrounded by the element isolation/insulation layer 42. The selection transistor 31 comprises diffusion regions 43 and 44 as source/drain regions, a gate insulation film 45 provided on a channel region between the diffusion regions 43 and 44, and a gate electrode 46 provided on the gate insulation film 45. The gate electrode 46 corresponds to a word line WL shown in FIG. 21.

On the diffusion region 43, there is provided a contact plug 47. On the contact plug 47, a bit line /BL is provided. On the diffusion region 44, a contact plug 48 is provided. On the contact plug 48, a lead electrode 49 is provided. On the lead electrode 49, an MTJ element 10 is provided. A bit line BL is provided on the MTJ element 10. An interlayer insulation layer 40 is filled between a semiconductor substrate 41 and the bit line BL.

As specifically described above, according to the fifth embodiment, an MRAM can be configured by using any of the MTJ elements 10 described in the first to fourth embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
   a first magnetic layer having an invariable magnetization direction;
   a second magnetic layer having a variable magnetization direction and having a film thickness of 2 nm or less;
   a tunnel barrier layer provided between the first magnetic layer and the second magnetic layer; and
   a buffer layer of a nitrogen compound provided in contact with a surface of the second magnetic layer, which is opposite to a surface of the second magnetic layer where the tunnel barrier layer is provided, the second magnetic layer comprising a CoFeB layer containing FeB and CoB at least on the tunnel barrier layer side, and a concentration of FeB in the second magnetic layer being higher than a concentration of CoB in the second magnetic layer.

2. The element of claim 1, wherein an orientation of the tunnel barrier layer conforms to an orientation of the second magnetic layer.

3. The element of claim 1, wherein the buffer layer is selected from AlN, ZrN, NbN and SiN.

4. The element of claim 1, wherein a composition of the buffer layer contains insufficient nitrogen compared with a stoichiometric composition.

5. The element of claim 1, wherein a damping constant of the second magnetic layer is less than or equal to about 0.005.

6. The element of claim 1, wherein:
the first magnetic layer comprises a reference layer having magnetic anisotropy in a direction perpendicular to a film surface; and
the second magnetic layer comprises a recording layer having magnetic anisotropy in a direction perpendicular to a film surface.

7. The element of claim 6, wherein the recording layer comprises a stacked layer structure comprising a first magnetic material layer on the tunnel barrier layer side, a second magnetic material layer on the buffer layer side, and a nonmagnetic layer provided between the first magnetic material layer and the second magnetic material layer.

8. The element of claim 7, wherein
the first magnetic material layer is the CoFeB layer, and the second magnetic material layer is a CoFe layer, and
a concentration of Fe in the first magnetic material layer is higher than a concentration of Co in the first magnetic material layer, and a concentration of Co in the second magnetic material layer is higher than a concentration of Fe in the second magnetic material layer.

9. The element of claim 6, wherein the recording layer has a stacked layer structure comprising a first magnetic material layer on the tunnel barrier layer side and a second magnetic material layer on the buffer layer side.

10. The element of claim 9, wherein
the first magnetic material layer is the CoFeB layer, and the second magnetic material layer is a CoFe layer, and
a concentration of Fe in the first magnetic material layer is higher than a concentration of Co in the first magnetic material layer, and a concentration of Co in the second magnetic material layer is higher than a concentration of Fe in the second magnetic material layer.

11. The element of claim 1, wherein the second magnetic layer comprises a recording layer having a stacked layer structure with a total thickness of 2 nm or less.

12. A magnetoresistive element comprising:
a first magnetic layer having an invariable magnetization direction;
a second magnetic layer having a variable magnetization direction;
a tunnel barrier layer provided between the first magnetic layer and the second magnetic layer; and
a buffer layer of AlN provided in contact with a surface of the second magnetic layer, which is opposite to a surface of the second magnetic layer where the tunnel barrier layer is provided, the buffer layer containing insufficient nitrogen compared with a stoichiometric composition,
the second magnetic layer comprising a CoFeB layer containing FeB and CoB at least on the tunnel barrier layer side, and a concentration of FeB in the second magnetic layer being higher than a concentration of CoB in the second magnetic layer.

13. The element of claim 12, wherein an orientation of the tunnel barrier layer conforms to an orientation of the second magnetic layer.

14. The element of claim 12, wherein a damping constant of the second magnetic layer is less than or equal to about 0.005.

15. The element of claim 14, wherein the second magnetic layer comprises a recording layer having a stacked layer structure with a total thickness of 2 nm or less.

16. The element of claim 12, wherein:
the first magnetic layer comprises a reference layer having magnetic anisotropy in a direction perpendicular to a film surface; and
the second magnetic layer comprises a recording layer having magnetic anisotropy in a direction perpendicular to a film surface.

17. The element of claim 16, wherein the recording layer has a stacked layer structure comprising a first magnetic material layer on the tunnel barrier layer side, a second magnetic material layer on the buffer layer side and a nonmagnetic layer provided between the first magnetic material layer and the second magnetic material layer.

18. The element of claim 17, wherein
the first magnetic material layer is the CoFeB layer, and the second magnetic material layer is a CoFe layer, and
a concentration of Fe in the first magnetic material layer is higher than a concentration of Co in the first magnetic material layer, and a concentration of Co in the second magnetic material layer is higher than a concentration of Fe in the second magnetic material layer.

19. The element of claim 16, wherein the recording layer has a stacked layer structure comprising a first magnetic material layer on the tunnel barrier layer side and a second magnetic material layer on the buffer layer side.

20. The element of claim 19, wherein
the first magnetic material layer is the CoFeB layer, and the second magnetic material layer is a CoFe layer, and
a concentration of Fe in the first magnetic material layer is higher than a concentration of Co in the first magnetic material layer, and a concentration of Co in the second magnetic material layer is higher than a concentration of Fe in the second magnetic material layer.

* * * * *